United States Patent [19]

Nakakita et al.

[11] Patent Number: 4,576,893
[45] Date of Patent: Mar. 18, 1986

[54] PRESENSITIZED LITHOGRAPHIC PRINTING PLATE PRECURSOR

[75] Inventors: Eiji Nakakita; Akinobu Koike; Toshiyuki Sekiya; Hiroshi Misu; Nobuyuki Kita, all of Shizuoka, Japan

[73] Assignee: Fuji Photo Film Co., Ltd., Kanagawa, Japan

[21] Appl. No.: 622,597

[22] Filed: Jun. 20, 1984

[30] Foreign Application Priority Data

Jun. 21, 1983 [JP] Japan ............................ 58-111672

[51] Int. Cl.$^4$ ............................ G03C 1/60; G03F 7/08
[52] U.S. Cl. .................................. 430/457; 430/171; 430/175; 430/176; 430/302
[58] Field of Search ............... 430/175, 176, 171, 302, 430/157

[56] References Cited

U.S. PATENT DOCUMENTS

| | | | |
|---|---|---|---|
| 3,219,447 | 11/1965 | Neugebauer et al. | 430/176 |
| 3,396,019 | 8/1968 | Uhlig et al. | 430/175 |
| 3,679,419 | 7/1972 | Gillich | 430/175 |
| 4,123,276 | 10/1978 | Kita et al. | 430/176 |
| 4,172,729 | 10/1979 | Narutomi et al. | 430/175 |
| 4,247,597 | 1/1981 | Russell | 430/108 |
| 4,294,905 | 10/1981 | Okishi et al. | 430/175 |
| 4,408,532 | 10/1983 | Incremona | 430/176 |
| 4,467,027 | 8/1984 | Yamamoto et al. | 430/175 |
| 4,477,552 | 10/1984 | Day | 430/176 |

OTHER PUBLICATIONS

Grant, J., Hackh's Chemical Dictionary, McGraw—Hill Co., 4th Ed., 1969, p. 220.
Encyclopaedia Chimica, vol. 4., p. 407.

Primary Examiner—Charles L. Bowers, Jr.
Attorney, Agent, or Firm—Sughrue, Mion, Zinn, Macpeak, and Seas

[57] ABSTRACT

A presensitized lithographic printing plate precursor is described, comprising an aluminum support that has been rendered hydrophilic having provided thereon a light-sensitive layer composed of a light-sensitive composition comprising (1) an organic solvent-soluble and substantially water-insoluble diazo resin, (2) a substantially water-insoluble, film-forming polymeric compound, and at least one of (3a) an organic solvent-soluble polymeric compound having a sulfonic acid group or a sulfonic acid salt group in its side chain and (3b) a substituted or unsubstituted dipicolinic acid or a salt thereof, the total amount of (3a) and (3b) components being about 1 to about 100% by weight, based on the weight of the diazo resin.

10 Claims, No Drawings

PRESENSITIZED LITHOGRAPHIC PRINTING PLATE PRECURSOR

FIELD OF THE INVENTION

This invention relates to a presensitized lithographic printing plate precursor. More particularly, this invention relates to a stable presensitized lithographic printing plate precursor having improved developability.

BACKGROUND OF THE INVENTION

It has been hitherto known that a lithographic printing plate having excellent ink-receptability can be obtained from a presensitized lithographic printing plate precursor having thereon a light-sensitive layer composed of a light-sensitive composition comprising a high molecular compound and a water insoluble diazo resin as disclosed in British Pat. No. 1,280,885 (corresponding to Japanese Patent Publication No. 1167/72), Japanese Patent Application OPI Nos. 24404/72, 38302/72, 9804/73 and 120903/78 (the term "OPI" as used herein refers to a "published unexamined Japanese patent application"), U.S. Pat. No. 4,123,276 and British Pat. No. 1,460,978.

However, a presensitized lithographic printing plate precursor produced by coating a light-sensitive composition comprising a high molecular compound and a water insoluble diazo resin onto an aluminum support that has been rendered hydrophilic undergoes deterioration in developability with the passage of time during storage, and the non-image areas may thus be stained with ink upon printing.

In order to eliminate the above-described disadvantage, attempts of incorporating various stabilizers in the light-sensitive composition have been made. For example, known stabilizers for this purpose include phosphorous acid (Japanese Patent Application OPI No. 151023/79), oxalic acid (U.S. Pat. No. 4,172,729), halogen-containing organic phosphoric acid ester compounds (Japanese Patent Application OPI No. 3620/75), heterocyclic diazonium salts (Japanese Patent Application OPI No. 143405/76), and phosphoric acid, sulfuric acid, organic sulfonic acids, polyacrylic acid, polyvinylphosphonic acid and polyvinylsulfonic acid (U.S. Pat. No. 3,679,417, Columns 6-7). Nevertheless, these known additives have not been found to produce a sufficiently desirable improvement in stability during storage.

SUMMARY OF THE INVENTION

Accordingly, an object of this invention is to provide a presensitized lithographic printing plate precursor which does not form stains in non-image areas upon printing, which are ascribed to poor developability resulting from the passage of time during storage.

Another object of this invention is to provide a presensitized lithographic printing plate precursor which easily hardens upon exposure to light, to exhibit excellent ink-receptability, with the non-image areas being easily removed by a developer.

The present inventors have conducted intensive investigations, and it has now been found that the above-described objects of the present invention can be accomplished by a presensitized lithographic printing plate precursor comprising an aluminum support that has been rendered hydrophilic having provided thereon a light-sensitive layer composed of a light-sensitive composition comprising (1) an organic solvent-soluble and substantially water-insoluble diazo resin, (2) a substantially water-insoluble, film-forming organic polymeric compound, and at least one of (3a) an organic solvent-soluble organic polymeric compound having a sulfonic acid group or a sulfonic acid salt group in its side chain and (3b) a dipicolinic acid (i.e., pyridine-2,6-dicarboxylic acid) or a salt thereof, the total amount of the (3a) and (3b) components being about 1 to about 100% by weight based on the weight of the diazo resin.

DETAILED DESCRIPTION OF THE INVENTION

The organic solvent-soluble and substantially water-insoluble diazo resin (1) which can be used in the present invention includes those exemplified by a condensation product of aromatic diazonium salts and, for example, active carbonyl-containing compounds, particularly, formaldehyde. Specific examples of such diazo resins are Lewis acid salts (e.g., hexafluorophosphate, tetrafluoroborate, etc.) of a condensate between p-diazodiphenylamine and formaldehyde or acetaldehyde as described in U.S. Pat. No. 3,294,533 (corresponding to Japanese Patent Publication No. 17602/64) and Japanese Patent Application OPI No. 98613/79; anionic surfactant salts of a condensate between p-diazodiphenylamine and formaldehyde as described in Japanese Patent Publication No. 6813/66 and Japanese Patent Application OPI No. 9804/73; phenol salts, fluorocaprates or sulfonates (e.g., triisopropylnaphthalenesulfonate, 4,4'-biphenyldisulfonate, 5-nitro-o-toluenesulfonate, 5-sulfosalicylate, 2,5-dimethylbenzenesulfonate, 2-nitrobenzenesulfonate, 3-chlorobenzenesulfonate, 2-chloro-5-nitrobenzenesulfonate, 2-fluorocaprylnaphthalenesulfonate, 1-naphthol-5-sulfonate, 2-methoxy-4-hydroxy-5-benzoylbenzenesulfonate, p-toluenesulfonate, etc.) of a condensate between p-diazodiphenylamine and formaldehyde as described in U.S. Pat. No. 3,300,309, Japanese Patent Application OPI No. 38302/72 and U.S. Pat. No. 4,123,276, organophosphonates of a condensate between p-diazodiphenylamine and formaldehyde as described in U.S. Pat. No. 3,404,003; aromatic carboxylates of a condensate between p-diazodiphenylamine and formaldehyde as described in Japanese Patent Publication No. 28594/70; and phosphates or oxalates of a condensate between p-diazodiphenylamine and formaldehyde. Other useful diazo resins include a condensate of a substituted or unsubstituted diphenylamine-4-diazonium salt and an ether compound, as described in U.S. Pat. No. 3,679,419. Of these, Lewis acid salts or organic acid salts of a condensate between an aromatic diazonium compound and an active carbonyl compound or active ether compound are preferred, because of their solubility in organic solvents and substantial insolubility in water. The term "substantially water-insoluble" as used with respect to the diazo resins in the present invention means that the solubility in water at ordinary temperature (20° C.) is about 1% by weight or less.

The polymeric organic compound (2) of the present invention which are substantially insoluble in water and are capable of forming a film preferably include resins that are compatible with the diazo resins, oleophilic, and abrasion-resistant. Specific examples of such resins include polystyrene, polyacrylate, polymethacrylate, polyester, polyamide, polyurethane, polycarbonate, epoxy resin, polyvinyl formal, polyvinyl butyral and alkylphenol-formaldehyde resin. Of these, polyacrylates or polymethacrylates having an acid value of about 10 to 200 are preferred. Particularly preferred polyacrylates and polymethacrylates are copolymers containing acrylic acid, methacrylic acid, crotonic acid or maleic acid as an essential component, such as multicomponent copolymers comprising (a) 2-hydroxyethyl acrylate or 2-hydroxyethyl methacrylate, (b) acrylonitrile or methacrylonitrile, (c) acrylic acid or methacrylic acid and, if desired, other copolymerizable monomers as described in Japanese Patent Application OPI No. 118802/75 (corresponding to U.S. Pat. No. 4,123,276); multicomponent copolymers comprising acrylic acid or methacrylic acid esterified with a group containing a terminal hydroxyl group and a dicarboxylic acid ester residue, acrylic acid or methacrylic acid and, if necessary, other copolymerizable monomers as described in Japanese Patent Application OPI No. 120903/78; multicomponent copolymers comprising a monomer having an aromatic hydroxyl group at its terminals (e.g., N-(4-hydroxyphenyl)methacrylamide, etc.), acrylic acid or methacrylic acid, and if necessary, other copolymerizable monomers as described in Japanese Patent Application OPI No. 98614/79; and multicomponent copolymers comprising (a) an alkyl acrylate or methacrylate, (b) acrylonitrile or methacrylonitrile and (c) an unsaturated carboxylic acid as described in Japanese Patent Application OPI No. 4144/81. Additionally, acidic polyvinyl alcohol derivatives and acidic cellulose derivatives can also be used. The term "substantially water insoluble" as used herein with respect to the organic polymeric compounds of the present invention means that the solubility in water at ordinary temperature (20° C.) is about 1% by weight or less.

The amounts of the diazo resin (1) and the organic polymeric compound (2) in the light-sensitive layer are preferably from about 3 to about 30% by weight, and more preferably from 5 to 20% by weight, for the diazo resin (1), and from about 70 to 95% by weight, and more preferably from 80 to 95% weight, for the polymeric compound (2), respectively, based on the total weight of both components. The smaller the amount of the diazo resin, the higher the sensitivity, but, if the amount of the diazo resin is less than about 3% by weight, photohardening property of the high molecular compound tends to become insufficient such that the photohardened film may be swollen with developer upon development, thus weakening the film. On the other hand, if the amount of the diazo resin exceeds about 30% by weight, there results a reduced sensitivity such that the product may not be able to be so practically used.

The organic polymeric compound having a sulfonic acid (or salt) group in its side chain which can be used in the present invention preferably includes polymers of a polymerizable monomer having a sulfonic acid group. For example, such polymers include those derived from monomers such as p-styrenesulfonic acid, 2-acrylamido-2-methylpropanesulfonic acid, ethylenesulfonic acid, 2-chloroethylenesulfonic acid, ethylenedisulfonic acid, 1-propene-1-sulfonic acid, 1-propene-2-sulfonic acid, 2-methyl-1,3-propenedisulfonic acid, 1-butene-1-sulfonic acid, 1-pentene-1-sulfonic acid, 1-hexene-1-sulfonic acid, 2-phenylethylenesulfonic acid, 1-methyl-2-phenylethylenesulfonic acid, 3-chloroallylsulfonic acid, allylsulfonic acid, 3-chloro-2-butenesulfonic acid, 3-chloromethallylsulfonic acid, methallylsulfonic acid, 3-methyl-2-butene-2-sulfonic acid, 3-phenylallylsulfonic acid, 3-phenylmethallylsulfonic acid, 2-benzylallylsulfonic acid, 2-chloro-4-styrenesulfonic acid, vinyltoluenesulfonic acid, α-methylstyrenesulfonic acid, etc. Of these, p-styrenesulfonic acid, 2-acrylamido-2-methylpropanesulfonic acid and ethylenesulfonic acid are particularly preferred. One or more of these monomers are selected and polymerized or copolymerized with other monomers. In conducting copolymerization, any monomer that can be copolymerized with the sulfonic acid group-containing monomer can be used. Particularly preferred examples of such monomers include, for example, alkyl acrylates (e.g., methyl acrylate, ethyl acrylate, n-propyl acrylate, isopropyl acrylate, n-butyl acrylate, isobutyl acrylate, n-amyl acrylate, isoamyl acrylate, n-hexyl acrylate, 2-ethylhexyl acrylate, n-octyl acrylate, n-decyl acrylate, 2-hydroxyethyl acrylate, etc.), alkyl methacrylates (e.g., methyl methacrylate, ethyl methacrylate, n-propyl methacrylate, isopropyl methacrylate, n-butyl methacrylate, isobutyl methacrylate, n-amyl methacrylate, 2-ethylhexyl methacrylate, n-octyl methacrylate, n-decyl methacrylate, 2-hydroxyethyl methacrylate, etc.), styrenes (e.g., styrene, o-methylstyrene, m-methylstyrene, p-methylstyrene, 2,4-dimethylstyrene, 2,5-dimethylstyrene, 3,4-dimethylstyrene, 3,5-dimethylstyrene, 2,4,5-trimethylstyrene, 2,4,6-trimethylstyrene, o-ethylstyrene, o-sec-butylstyrene, o-tert-butylstyrene, p-fluorostyrene, 2,5-difluorostyrene, o-chlorostyrene, m-chlorostyrene, p-chlorostyrene, 2,4-dichlorostyrene, 2,5-dichlorostyrene, 2,6-dichlorostyrene, 3,4-dichlorostyrene, p-bromostyrene, p-cyanostyrene, etc.), acrylonitrile, methacrylonitrile, acrylamide, methacrylamide, acrylic acid, methacrylic acid, vinyl acetate, etc.

The molecular weight of the organic polymeric compound (3a) having a sulfonic acid (or salt) group in its side chain which can be used in the present invention is not particularly limited as long as it is organic solvent-soluble, but generally ranges from about 1,000 to about 1,000,000, preferably 5,000 to 100,000.

The amount of the organic polymeric compound (3a) having a sulfonic acid (or salt) group in its side chain ranges from about 1 to about 100% by weight, and preferably is from 10 to 50% by weight, based on the weight of the diazo resin. If the amount to be added is less than about 1% by weight, the effect for preventing stains is not sufficient. With amounts exceeding about 100% by weight, the film strength of the light-sensitive layer decreases so as to deteriorate printing resistance.

The dipicolinic acid (i.e., pyridine-2,6-dicarboxylic acid) or its salt (3b) which can be used in the present invention may be either unsubstituted or substituted with substituents such as chloro, methyl, hydroxy, nitro, 3-nitrophenyl, etc. Such groups are preferably substituted at the 4-position of dipicolinic acid (or salt). The amount of the dipicolinic acid (or salt) to be used in the light-sensitive layer ranges from about 1 to about 100% by weight, and preferably is from 10 to 50% by weight, based on the weight of the diazo resin.

The light-sensitive layer of the presensitized lithographic printing plate precursor according to the present invention may contain various additives, such as alkyl ethers (e.g., ethyl cellulose or methyl cellulose) and fluorine-containing surface active agents for improving coating properties; plasticizers (e.g., tricresyl phosphate, dimethyl phthalate, dibutyl phthalate, trioctyl phosphate, tributyl phosphate, tributyl citrate, polyethylene glycol, polypropylene glycol, etc.) for imparting softness and abrasion-resistance to a coated film; and pigments (e.g., acridine dyes, cyanine dyes, styryl dyes, triphenylmethane dyes, phthalocyanine dyes, etc.) for visualizing images, particularly pigments capable of forming salts which can impart a printing-out effect, e.g., Crystal Violet (CI 42555), Methyl Violet 2B (CI 42535), Malachite Green (CI 42000), Fuchsine (CI 42510), Crystal Violet-carbinol base (CI 42555:1), Parafuchsine (CI 42500), Sudan Blue G (CI 61520), Acilan Brilliant Blue 5B (CI 42740), Acilan Violet s4BN (CI 42640), Astradiamond Green GX (CI 42040), Rhodamine B (CI 45170), Samaron Blue PA7 (CI 62500), Victoria Blue B (CI 44045), Alizarin Direct Blue (CI 62055), Victoria Pure Blue BOH (CI 42595), Brilliant Green (CI 42040), Nile Blue BX (CI 51185), Neutral Red (CI 50040), Rhoduline Pure Blue 3G (CI 51004), an abietic acid salt of Victoria Pure Blue BOH, p-toluenesulfonate of Victoria Pure Blue BOH, p-toluenesulfonate of Crystal Violet, etc.

These dyes or pigments can generally be used in an amount of from about 5 to about 100% by weight, and preferably from 10 to 40% by weight, based on the weight of the diazo resin (1). When the salt-forming dye is used in combination with the diazo resin, an acid formed by photodecomposition of the diazo resin and the salt-forming dye react to form a salt, which causes fading or color development, i.e., printing-out, by appropriately selecting a dye which changes its color markedly in the specific formulation used.

The light-sensitive layer of the present invention can further contain stabilizers for the diazo resin, such as anionic surface active agents, e.g., phosphoric acid, phosphorous acid, pyrophosphoric acid, polyphosphoric acid, oxalic acid, boric acid, tartaric acid, toluenesulfonic acid, p-chlorosulfonic acid, sodium isopropylnaphthalenesulfonate, sodium t-butylnaphthalenesulfonate, disodium methylenedinaphthalenedisulfonate, a sodium salt of sulfonated alkyldiphenyl oxide, a sodium salt of condensed arylsulfonate, sodium naphthalenealkylsulfonate, etc.; polycyclic aromatic sulfonic acids, e.g., naphthalene-1-sulfonic acid, naphthalene-2-sulfonic acid, 2,6-di-t-butylnaphthalenesulfonic acid, 2,6-di-t-butylnaphthalenedisulfonic acid, 1,8-dinitronaphthalene-3,6-disulfonic acid, 2-diazo-1-naphthol-4-sulfonic acid, 4,4'-diazostilbene-3,3'-disulfonic acid, naphthalene-1,5-disulfonic acid, anthraquinone-2-sulfonic acid, anthraquinone-2,6-disulfonic acid, etc. and their salts; 2-methoxy-4-hydroxy-5-benzoylsulfonic acid and its salts; 5-nitronaphthalene-1-phosphonic acid; 4-chlorophenoxymethylphosphonic acid; sodium phenylmethylpyrazolonesulfonate; 2-phosphonobutane-1,2,4-tricarboxylic acid; 1-phosphonoethane-1,2,2-tricarboxylic acid; 1-hydroxyethane-1,1-disulfonic acid; etc. The amount of these stabilizers varies depending on the purpose of addition, but is generally about 0.5 to 30% by weight based on the total solid content of the light-sensitive layer.

The above-described light-sensitive composition is dissolved in an organic solvent and coated on an aluminum plate that has been rendered hydrophilic in an amount of 0.5 to 5 g/m² (dry basis), followed by drying. The concentration of the light-sensitive composition to be coated is preferably 1 to 50% by weight, and the solvent used for coating suitably includes methyl cellosolve, ethyl cellosolve, methyl cellosolve acetate, acetone, methyl ethyl ketone, methanol, dimethylformamide, dimethyl sulfoxide, ethylene dichloride, cyclohexanone, dioxane, tetrahydrofuran and mixtures thereof, and mixed solvents comprising these solvents or mixtures thereof and a small amount of a solvent incapable of dissolving the diazo resin or the high molecular compound, such as water and toluene. The coated light-sensitive composition is then dried, preferably at a temperature of 50° C. to 120° C. The drying may be carried out at a lower initial temperature (within the above range) for preliminary drying and then at an elevated temperature, or may be carried out at a high temperature (within the above range) from the beginning by appropriately selecting the solvent and the concentration of the coating composition.

In the production of a lithographic printing plate from the presensitized lithographic printing plate precursor thus obtained, the presensitized lithographic printing plate precursor is imagewise exposed to light and then processed with a developer comprising a weakly alkaline aqueous solution to obtain a negative relief image of the original image. Suitable light sources for light exposure include a carbon arc lamp, a mercury lamp, a xenon lamp, a metal halide lamp, strobo, ultraviolet rays, laser beams, etc. Any developer can be used for removing the non-exposed areas as long as it dissolves the non-exposed areas of the light-sensitive layer. In particular, a suitable developer to be used for a light-sensitive layer using a polyacrylate or polymethacrylate having an acid value of 10 to 200 as a binder is a weakly alkaline aqueous solution comprising an organic solvent having low water solubility, an alkali agent, an anionic surface active agent (e.g., aromatic sulfonates, dialkylsulfosuccinates, naphthalenealkylsulfonates, sulfuric ester salts of an ethylene oxide adduct of naphthol and branched alkylsulfuric esters) and water, as described in Japanese Patent Application OPI Nos. 77401/76, 80228/76 and 52054/80, and U.S. Pat. No. 4,186,006 (corresponding to Japanese Patent application OPI No. 44202/78).

The aluminum support to be coated with the light-sensitive composition according to the present invention is preferably prepared by graining the surface of an aluminum plate by wire brush graining, brush graining with a pumice slurry as an abrasive agent, ball graining, chemical graining, electrolysis graining or a combination of these techniques, and, if desired, anodically oxidizing the plate in sulfuric acid, phosphoric acid, oxalic acid, boric acid, chromic acid, sulfamic acid or a mixed acid thereof using a direct or alternating current power source, to thus form a firm, immobilized film on the surface of the aluminum plate. Such an immobilized film per se is sufficient to render the aluminum surface hydrophilic, but, if desired, the aluminum surface can also be subjected to surface treatment with silicates (e.g., sodium silicate and potassium silicate) as described in U.S. Pat. Nos. 2,714,066 and 3,181,461, potassium fluorozirconate as described in U.S. Pat. No. 2,946,638, phosphomolybdates as described in U.S. Pat. No. 3,201,247, polyacrylic acids as described in German Pat. No. 1,091,433, polyvinylphosphonic acid as described in German Pat. No. 1,134,093 and British Pat. No. 1,230,447, phosphonic acid as described in Japanese Patent Publication No. 6409/69, phytic acid as described in U.S. Pat. No. 3,307,951, or a combination of a hydrophilic organic polymeric compound and a divalent metal as described in Japanese Patent Application OPI Nos. 16893/83 and 18291/83; or subbing treatment with a water soluble polymer having a sulfonic acid group. In addition, electrodeposition of silicates as described in U.S. Pat. No. 3,658,662 may also be used for imparting hydrophilicity.

The present invention will now be illustrated in greater detail with reference to examples, but it is to be understood that the present invention is not limited thereto. In these examples, all percentages are by weight.

EXAMPLE 1

A 0.24 mm thick 1S-aluminum plate was soaked for 3 minutes in a 10% aqueous solution of sodium tertiary phosphate kept at 80° C. to degrease the plate. After washing with water, the surface of the plate was rubbed with a nylon brush while applying thereto a pumice slurry to conduct graining, followed by washing with water. The plate was desmutted with a 3% aqueous solution of sodium aluminate at 60° C., and then further subjected to electrolytic graining in dilute nitric acid. The plate thus treated was anodically oxidized in 20% sulfuric acid at a current density of 2 A/dm$^2$ for 2 minutes, followed by treating with a 2.5% aqueous solution of sodium silicate at 70° C. for 1 minute.

On the resulting aluminum support, the light-sensitive composition having the following composition was coated in an amount of 2.5 g/m$^2$ (dry basis), followed by drying at 100° C. for 2 minutes, to thereby obtain a presensitized lithographic printing plate precursor.

| Light-Sensitive Composition: | |
|---|---|
| 2-Hydroxyethyl methacrylate copolymer (as described in Example 1 of U.S. Pat. No. 4,123,276) | 0.87 g |
| 2-Methoxy-4-hydroxy-5-benzoylbenzenesulfonate of a condensate between p-diazodiphenylamine and p-formaldehyde | 0.10 g |
| Dye-Oil Blue #603 (manufactured by Orient Kagaku Kogyo KK) | 0.03 g |
| Methyl methacrylate/ethyl acrylate/sodium 2-acrylamido-2-methylpropanesulfonate copolymer (50:30:20 by mol) | 0.01 g |
| Ethylene glycol monomethyl ether | 100 g |
| Methanol | 30 g |
| Methyl ethyl ketone | 60 g |
| Water | 2 g |

The resulting presensitized lithographic printing plate precursor was left to stand for 5 days under forced deterioration conditions of 45° C. and 75% RH, then imagewise exposed to light, and developed by a vat development method at 25° C. for 60 seconds using a developer consisting of 30 g of benzyl alcohol, 10 g of triethanolamine, 10 g of sodium isopropylnaphthalenesulfonate, 2 g of sodium sulfite, 0.5 g of sodium nitrilotriacetate and 950 g of tap water. After washing with water, a desensitizing gum comprising an aqueous gum arabic solution was applied onto the plate.

The lithographic printing plate thus obtained was mounted on a printing machine, and printing was conducted to examine the formation strains in the non-image areas of the prints, but no stains were observed.

For comparison, a presensitized lithographic printing plate was prepared in the same manner as described above, except that the light-sensitive composition did not contain the sodium 2-acrylamido-2-methylpropanesulfonate copolymer. When the resulting comparative printing plate was tested under the same forced deterioration conditions to observe stains in the non-image areas, the printing ink adhered to the entire surface of the prints and satisfactory prints could not be obtained.

EXAMPLE 2

The same procedures as described in Example 1 were repeated, except for using dipicolinic acid in place of the sodium 2-acrylamido-2-methylpropanesulfonate copolymer. When the resulting printing plate precursor was left to stand under the same deterioration conditions as in Example 1, the printing plate obtained therefrom could produce fine prints free from stains in the non-image areas upon printing.

EXAMPLE 3

A 0.24 mm thick 2S aluminum plate was soaked for 3 minutes in a 10% aqueous solution of sodium tertiary phosphate kept at 80° C. for degreasing. The degreased aluminum plate was grained using a nylon brush and a pumice slurry and then desmutted in a 3% aqueous solution of sodium aluminate at 60° C. The plate was subjected to anodic oxidation in 20% sulfuric acid at a current density of 2 A/dm$^2$ for 2 minutes and then treated with a 3% aqueous solution of potassium silicate at 70° C. for 1 minute. The aluminum plate thus surface-treated was coated with the light-sensitive composition shown below, at a dry amount of 1.5 g/m$^2$, followed by drying at 100° C. for 2 minutes, to prepare a presensitized lithographic printing plate precursor.

| Light-Sensitive Composition: | |
|---|---|
| 2-Hydroxyethyl methacrylate copolymer (as prepared below) | 5.0 g |
| PF$_6$ salt of a condensate between p-diazodiphenylamine and p-formaldehyde (PF$_6$ salt substitution: 98%) | 0.7 g |
| Victoria Pure Blue BOH (manufactured by Hodogaya Chemical Co., Ltd.) | 0.1 g |
| Sodium 2-acrylamido-2-methylpropanesulfonate copolymer (the same as in Example 1) | 0.01 g |
| Phosphorous acid | 0.01 g |
| Ethylene glycol monomethyl ether | 50 g |
| Methanol | 16 g |
| Methyl ethyl ketone | 32 g |
| Water | 1 g |

The resulting presensitized lithographic printing plate precursor was allowed to stand for 5 days under forced deterioration conditions of 45° C. and 75% RH and then imagewise exposed to light. The plate was developed with a developer consisting of 450 g of benzyl alcohol, 150 g of triethanolamine, 10 g of monoethanolamine, 150 g of sodium t-butylnaphthalenesulfonate, 30 g of sodium sulfite and 8,420 g of ion-exchange water at 25° C. for 50 seconds by the use of a commercially available automatic developing machine.

The printing plate thus obtained was mounted on a printing machine, and printing was conducted. Fine prints were obtained free from any stain in the non-image areas. In addition, the above printing plate precursor exhibited a clear printing-out property upon imagewise exposure.

For comparison, a lithographic printing plate precursor was prepared in the same manner as described above except that the light-sensitive composition did not contain the sodium 2-acrylamido-2-methylpropanesulfonate copolymer of Example 1. The comparative printing plate precursor showed a clear printing-out property upon imagewise exposure to light, but the printing plate prepared therefrom only produced unsatisfactory prints with stains in the non-image areas.

The 2-hydroxyethyl methacrylate copolymer used in this example was prepared as follows:

100 g of ethylene glycol monomethyl ether was heated to 100° C. in a nitrogen stream, and a mixture consisting of 23 g of 2-hydroxyethyl methacrylate, 27.5 g of acrylonitrile, 43 g of benzyl methacrylate, 6.5 g of methacrylic acid and 0.4 g of benzoyl peroxide was added thereto dropwise over a period of 2 hours. 15 minutes later from the completion of the dropwise addition, 100 g of ethylene glycol monomethyl ether and 0.1 g of benzoyl peroxide were added to the reaction mixture, followed by allowing the mixture to react for 4 hours. After completion of the reaction, the reaction mixture was diluted with methanol and poured into water to precipitate the formed copolymer. Vacuum drying of the precipitate at 70° C. gave a 2-hydroxyethyl methacrylate copolymer having an acid value of 40.

EXAMPLE 4

The same procedures as in Example 3 were repeated, except that the sodium 2-acrylamido-2-methylpropanesulfonate copolymer was replaced by a methyl methacrylate/methyl acrylate/sodium p-styrenesulfonate copolymer (30:40:30 by mol), an N-t-butylacrylamide/methyl acrylate/sodium p-styrenesulfonate/sodium 2-acrylamido-2-methylpropanesulfonate copolymer (40:40:10:10 by mol) or a methyl methacrylate/methyl acrylate/sodium 2-acrylamido-2-methylpropanesulfonate/methacrylic acid copolymer (40:40:10:10 by mol). When each of the resulting printing plates was tested in the same manner as described in Example 3, the similar results were obtained.

While the invention has been described in detail and with reference to specific embodiments thereof, it will be apparent to one skilled in the art that various changes and modifications can be made therein without departing from the spirit and scope thereof.

What is claimed is:

1. A presensitized lithographic printing plate precursor comprising an aluminum support that has been rendered hydrophilic and has provided thereon, a light-sensitive layer composed of a light-sensitive composition comprising in admixture (1) an organic solvent-soluble snd substantially water-insoluble light-sensitive diazo resin, (2) a substantially water-insoluble, film-forming organic polymeric compound, and (3) at least one of a substituted or unsubstituted pyridine-2,6-dicarboxylic acid, wherein said diazo resin is present in an amount of from about 3 to about 30% by weight, based on the total weight of the diazo resin (1) and the substantially water-insoluble, film forming organic polymeric compound (2), and wherein said substituted or unsubstituted pyridine-2,6-dicarboxylic acid is present in an amount of from about 1 to about 100% by weight based on the weight of the diazo resin.

2. A presensitized lithographic printing plate precursor as in claim 1, wherein the diazo resin is a Lewis acid salt or organic acid salt of a condensate between an aromatic diazonium compound and an active carbonyl compound or active ether compound.

3. A presensitized lithographic printing plate precursor as in claim 1, wherein the substantially water-insoluble, film-forming organic polymeric compound is a polyacrylate or polymethacrylate having an acid value of from about 10 to about 200.

4. A presensitized lithographic printing plate precursor as in claim 3, wherein the organic polymeric compound is a multicomponent copolymer comprising at least (a) 2-hydroxyethyl acrylate or 2-hydroxyethyl methacrylate, (b) acrylonitrile or methacrylonitrile and (c) acrylic acid or methacrylic acid; a multicomponent copolymer comprising at least acrylic acid or methacrylic acid esterified with a group containing a terminal hydroxyl group and a dicarboxylic acid ester residue and acrylic acid or methacrylic acid; a multicomponent copolymer comprising at least a monomer having aromatic hydroxyl groups at its terminals and acrylic acid or methacrylic acid; or a multicomponent copolymer comprising at least (a) an alkyl acrylate or alkyl methacrylate, (b) acrylonitrile or methacrylonitrile and (c) an unsaturated carboxylic acid.

5. A presensitized lithographic printing plate precursor as in claim 1, wherein the diazo resin is present in an amount of from 5 to 20% by weight, based on the total weight of the diazo resin (1) and the substantially water-insoluble, film-forming organic polymeric compound (2).

6. A presensitized lithographic printing plate precursor as in claim 1, wherein the substantially water-insoluble, film-forming organic polymeric compound is present in an amount of from about 70 to 95% by weight, based on the total weight of the diazo resin (1) and said organic polymeric compound (2).

7. A presensitized lithographic printing plate precursor as in claim 1, wherein the light-sensitive composition is coated on the aluminum support in an amount of from 0.5 to 5 g/m$^2$ (dry basis).

8. A presensitized lithographic printing plate precursor as in claim 1, wherein the substituted or unsubstituted pyridine-2,6-dicarboxylic acid (3) is present in an amount of from 10 to 50% by weight, based on the weight of the diazo resin (1).

9. A presensitized lithographic printing plate precursor as in claim 1, wherein a dye or pigment is incorporated in the light-sensitive composition in an amount of from about 5 to about 100% by weight, based on the weight of the diazo resin (1).

10. A presensitized lithographic printing plate precursor as in claim 1, wherein a dye or pigment is incorporated in the light-sensitive composition in an amount of from about 10 to about 40% by weight, based on the weight of the diazo resin (1).

* * * * *